US011448718B2

(12) United States Patent
Chebrolu et al.

(10) Patent No.: US 11,448,718 B2
(45) Date of Patent: Sep. 20, 2022

(54) SUBTLE INTENSITY GRADUATING HOMOMORPHIC TRANSFORM TO IMPROVE CONSPICUITY OF LOW-INTENSITY PATHOLOGIES

(71) Applicant: Siemens Healthcare GmbH, Erlangen (DE)

(72) Inventors: Venkata Veerendranadh Chebrolu, Rochester, MN (US); Eric Stinson, Rochester, MN (US); Peter Kollasch, Minnetonka, MN (US)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/181,241

(22) Filed: Feb. 22, 2021

(65) Prior Publication Data

US 2021/0311148 A1 Oct. 7, 2021

Related U.S. Application Data

(60) Provisional application No. 63/003,380, filed on Apr. 1, 2020.

(51) Int. Cl.
*G01R 33/56* (2006.01)
*G06T 5/00* (2006.01)
*G01R 33/54* (2006.01)
*G01R 33/561* (2006.01)

(52) U.S. Cl.
CPC ....... *G01R 33/5608* (2013.01); *G01R 33/546* (2013.01); *G01R 33/5607* (2013.01); *G01R 33/5617* (2013.01); *G06T 5/001* (2013.01); *G06T 2207/10088* (2013.01); *G06T 2207/30004* (2013.01)

(58) Field of Classification Search
CPC .............. G01R 33/5608; G01R 33/546; G01R 33/5607; G01R 33/5617; G06T 5/001; G06T 2207/10088; G06T 2207/30004
See application file for complete search history.

(56) References Cited

U.S. PATENT DOCUMENTS

2009/0087066 A1* 4/2009 Odry .................... G06V 10/443
382/131
2009/0273343 A1* 11/2009 Borthakur .............. A61B 5/055
324/307

OTHER PUBLICATIONS

Juras, Vladimir, et al. "Magnetic resonance imaging of the musculoskeletal system at 7T: morphological imaging and beyond." Topics in Magnetic Resonance Imaging 28.3 (2019): 125. (Year: 2019).*

Friebe, Bjorn, et al. "Assessment of low-grade meniscal and cartilage damage of the knee at 7 T: a comparison to 3 T imaging with arthroscopic correlation." Investigative Radiology 53.7 (2018): 390-396. (Year: 2018).*

(Continued)

*Primary Examiner* — Rishi R Patel

(57) ABSTRACT

The present disclosure is directed to systems and methods for visualizing low-intensity pathologies or anatomical structures. The method can include applying, via a MRI machine, an RF pulse configured to suppress the imaging of fat in the subject and acquiring, via the MRI machine, an image of the subject. A subtle intensity graduating homomorphic transform is applied to the acquired image to provide improved visualized of the low-intensity pathology or anatomical structure. The resulting transformed image can be output to the user.

12 Claims, 6 Drawing Sheets

(56) References Cited

OTHER PUBLICATIONS

Chebrolu, Venkata Veerendranadh, et al. "Uniform combined reconstruction of multichannel 7T knee MRI receive coil data without the use of a reference scan." Journal of Magnetic Resonance Imaging 50.5 (2019): 1534-1544. (Year: 2019).*

"2020 ISMRM & SMRT Virtual Conference & Exhibition" ISMRMR. org <https://www.ismrm.org/20M/> (Year: 2022).*

Chebrolu, et al., "Subtle Intensity Graduating Homomorphic Transform with a Small-percentage of Fat-saturation to Improve Conspicuity of Meniscal Tears at 7T", Proc Intl. Soc. Mag. Reson. Med. 28 (2020) 2801.

* cited by examiner

SUBTLE INTENSITY GRADUATING HOMOMORPHIC TRANSFORM TO IMPROVE CONSPICUITY OF LOW-INTENSITY PATHOLOGIES

PRIORITY

The present application claims priority to U.S. Provisional Patent Application No. 63/003,380, titled "Subtle Intensity Graduating Homomorphic Transform (SIGHT) with Small Percentage Fat-saturation to Improve Conspicuity of Meniscal Tears at 7T," filed Apr. 1, 2020, which is hereby incorporated by reference herein in its entirety.

BACKGROUND

Detecting meniscal tears is an important component of routine knee magnetic resonance imaging (MRI). Conventionally, knee meniscal tears are visualized using turbo-spin-echo (TSE) sequence-based proton-density (PD)-weighted sagittal MR images without fat saturation. The conspicuity of meniscal tears depends on multiple factors, including the spatial resolution (or voxel size) of the MRI data, the dynamic range of the intensities in the image, the intensities of the regions around the menisci (i.e., the contrast between the meniscal region and the surrounding tissue), the intensity or sensitivity profile of the receive coil, the transmitted B1 inhomogeneity at or near the menisci, the window-width (WW) and window-level (WL) used for visualizing the meniscal tears, and the image post-processing techniques used. Some of these factors are common to all MRI field strengths, but factors such as the receive and transmit inhomogeneity are accentuated at higher field strengths, especially at ultra-high field (UHF) strengths such as 7T. Conventionally, UHF MRI systems have not been available for clinical use; however, a 7T MRI system has recently received FDA approval for clinical use. Therefore, addressing the unique challenges in visualizing meniscal tears and other low-intensity pathologies at 7T is of paramount importance for routine clinical use of such 7T MRI systems.

Accordingly, there is a need in the technical field for image processing techniques that are adapted for improving the visualization of low-intensity pathologies (e.g., meniscal tears) with high field strength (e.g., 7T) MRI systems.

SUMMARY

In one embodiment, the present disclosure is directed to an MRI system for imaging a subject, the MRI system comprising: an MRI machine; and a computer system coupled to the MRI machine, the computer system comprising: a processor, and a memory coupled to the processor, the memory storing instructions that, when executed by the processor, cause the computer system to: apply, via the MRI machine, an RF pulse configured to suppress the imaging of fat in the subject, acquire, via the MRI machine, an image of the subject, apply a transformation to the acquired image to generate a transformed image, the transformation (Y) defined by:

$$Y = \frac{X^{(\frac{p}{q})}}{m^{(\frac{p}{q})}} \times C$$

wherein X is a voxel intensity of the acquired image, m is a maximum intensity present in the acquired MRI image, (p/q) is a scaled power of the transformation, and C is a scalar, and output the transformed image.

In another embodiment, the present disclosure is directed to a computer-implemented method for imaging a subject, the method comprising: applying, via an MRI machine, an RF pulse configured to suppress the imaging of fat in the subject; acquiring, via the MRI machine, an image of the subject; applying a transformation to the acquired image to generate a transformed image, the transformation (Y) defined by:

$$Y = \frac{X^{(\frac{p}{q})}}{m^{(\frac{p}{q})}} \times C$$

wherein X is a voxel intensity of the acquired image, m is a maximum intensity present in the acquired MRI image, (p/q) is a scaled power of the transformation, and C is a scalar; and outputting the transformed image.

FIGURES

The accompanying drawings, which are incorporated in and form a part of the specification, illustrate the embodiments of the invention and together with the written description serve to explain the principles, characteristics, and features of the invention. In the drawings.

DESCRIPTION

This disclosure is not limited to the particular systems, devices and methods described, as these may vary. The terminology used in the description is for the purpose of describing the particular versions or embodiments only, and is not intended to limit the scope.

Methods and Systems for Improved Visualization of Low-Intensity Pathologies

This disclosure is generally directed to MR image transformations for improving the visualization of particular anatomical structures or pathologies and MRI systems configured to utilize such transformations. Various aspects of the disclosure utilize MRI image reconstruction algorithms to apply a transformation to the raw MR image data to improve the visualization of a low-intensity pathology (e.g., a meniscal tear) or an anatomical structure associated there-with (e.g., a meniscus). In various embodiments, MRI systems can be programmed or otherwise configured to implement these types of transformations for imaging a subject.

Figure 1:
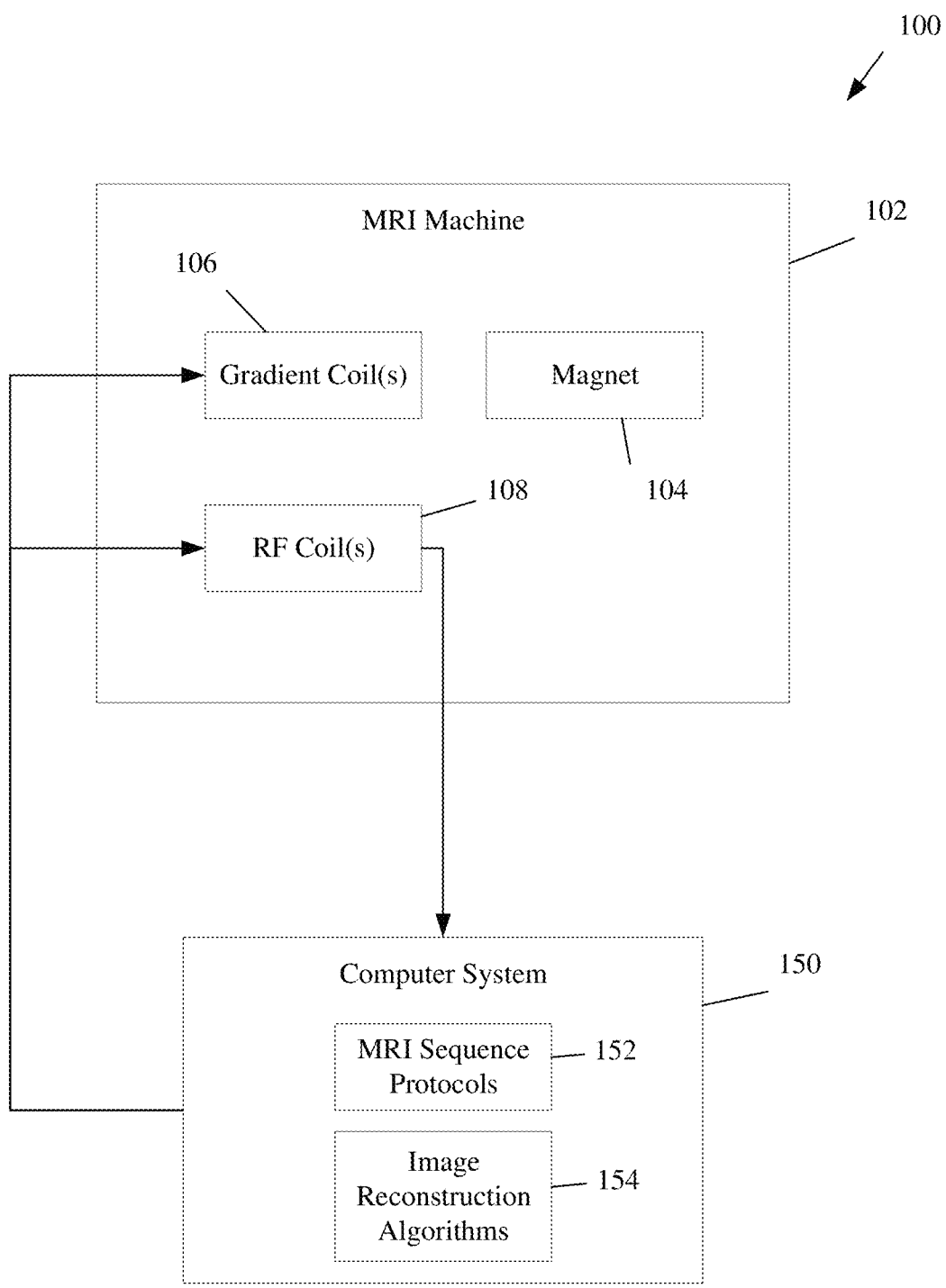
FIG. 1 is a diagram of an MRI system configured to visualize a low-intensity pathology, in accordance with at least one aspect of the present disclosure.

Referring now to FIG. 1, there is shown a diagram of an illustrative MRI system 100 that can be used in various embodiments of the present disclosure. The MRI system 100 can include an MRI machine 102 that is operably coupled to a computer system 150. The MRI machine 102 can include a magnet 104 extending along a bore that is configured to receive a subject therein and that is configured to produce a generally uniform magnetic field, one or more gradient coils 106 that are configured to produce magnetic field gradients (e.g., linear gradients), and one or more RF coils 108 that are configured to transmit the RF signals to the subject's body and/or receive RF signals therefrom. The computer system 150 (embodiments of which are described in greater detail below) can store and implement MRI sequence protocols 152 and image reconstruction algorithms 154, as well as a variety of other software modules known in the technical field. An MRI sequence can generally be defined as a series of radiofrequency (RF) pulses and gradients that are used to generate a set of images having a particular desired appearance. The MRI sequence protocols 152 can be embodied as instructions that, when executed by the computer system 150, cause the computer system 150 to control the gradient coils 106 and/or RF coils 108 to apply a particular sequence of magnetic field gradients and/or RF pulses to the subject. In one embodiment, the MRI sequence protocols 152 could include fat suppression MRI sequences, such as a 2D turbo-spin-echo (TSE) MRI sequence. The image reconstruction algorithms 154 can be embodied as instructions that, when executed by the computer system 150, cause the computer system 150 to reconstruct an image of the subject based on the RF signal received from the subject (e.g., by the RF coils 108) as caused by the MRI sequence applied thereto. The image reconstruction algorithms 154 can further include one or more transformations applied to the raw image data acquired via the MRI machine 102 to generate a transformed image that is output to the user (e.g., via a display 824 as in FIG. 3).

In one embodiment, the image reconstruction algorithms 154 can include a subtle intensity graduating homomorphic transform (SIGHT). This transformation (Y) can be defined as:

$$Y = \frac{X^{\left(\frac{p}{q}\right)}}{m^{\left(\frac{p}{q}\right)}} \times C$$

where X is a voxel intensity of the acquired image, m is a maximum intensity present in the acquired MRI image, (p/q) is a scaled power of the transformation, and C is a scalar. In one embodiment, q can be a value greater than p. In one embodiment, C can be equal to 4095 (e.g., representative of the maximum possible intensity value). In some examples described herein, (p/q) values of ⅔, ½, and ⅖ have been utilized. However, the present disclosure is not limited to any particular values for p and q.

Figure 2:
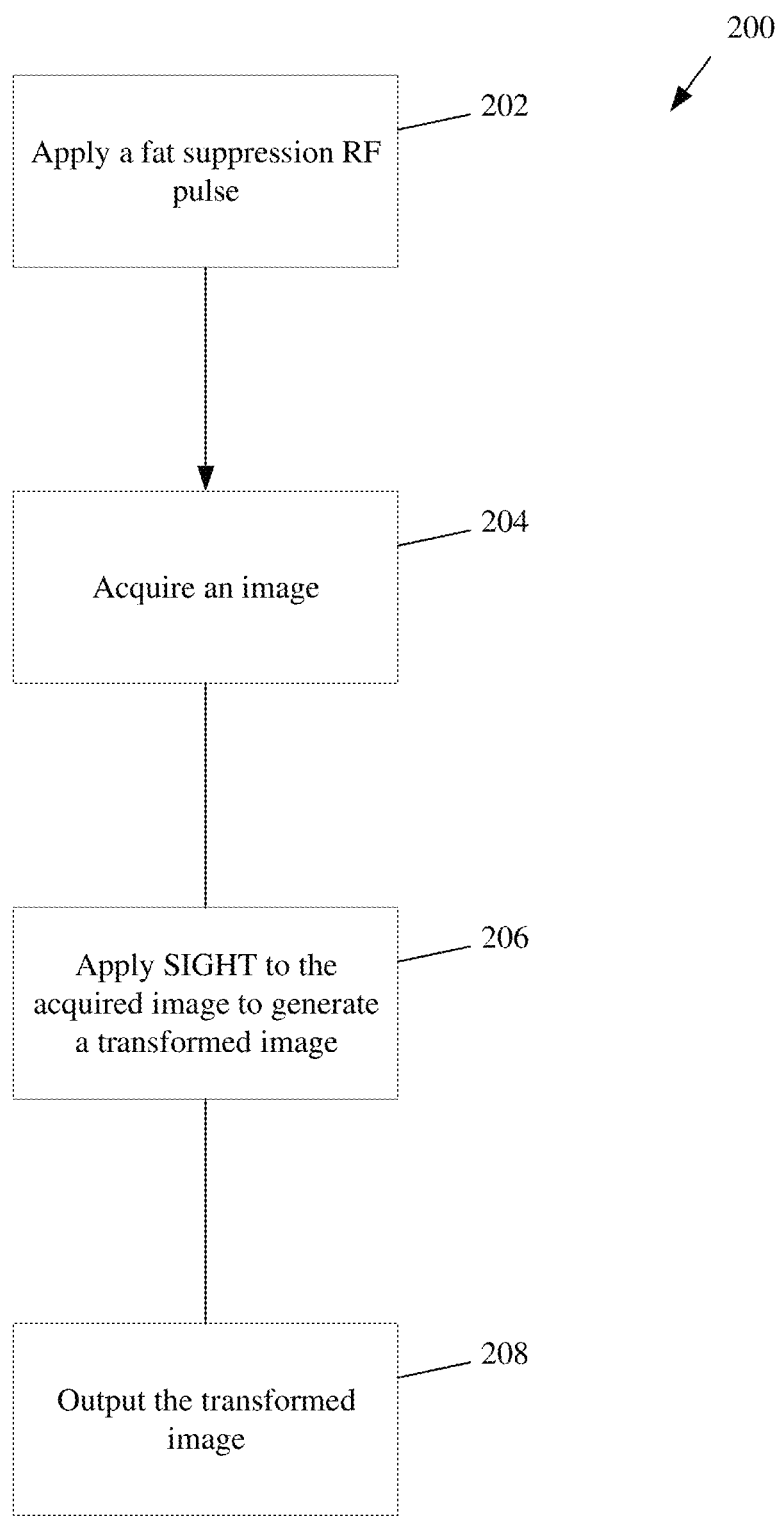
FIG. 2 is a flow diagram of a process for generating a transformed image for visualizing a low-intensity pathology, in accordance with at least one aspect of the present disclosure.

In various embodiments, the systems and methods described above can be used to improve the visualization of low-intensity pathologies, such as meniscal tears. As one illustrative example, FIG. 2 illustrates one such process 200 for improving the visualization of low-intensity pathologies using SIGHT. However, it should be noted FIG. 2 is simply provided for illustrative purposes and the systems and methods described herein are not limited solely to the illustrated application. The process 200 and/or various steps thereof can be embodied as hardware, software, firmware, or any combination thereof. In on embodiment, the process 200 can be embodied as instructions stored in a memory (e.g., the main memory 804) that, when executed by a processor (e.g., the processor(s) 802), cause the computer system 150 to perform the described process 200 and/or one or more steps thereof.

Accordingly, the computer system 150 executing the process 200 can control the MRI machine 102 to apply 202 a fat suppression RF pulse to the subject. In one embodiment, the RF pulse could include a fat saturation RF pulse or a low flip angle RF pulse. It can be beneficial to apply a fat suppression RF pulse because it has been demonstrated that controlling the brightness of fat by applying a small percentage of fat saturation improves the dynamic-range of image intensities in PD-weighted turbo-spin-echo (TSE) MRI, which in turn improves the conspicuity of meniscal tears at 3T and 7T. In particular, fat affects the dynamic-range of the intensities and the contrast between meniscal region and the bone marrow in a PD-weighted MRI (PD-MRI). If bone marrow is very bright, low intensity pathologies, such as meniscal tears near bone marrow, would be less conspicuous with typical WW and WLs. The Digital Imaging and Communications in Medicine (DICOM) standard typically uses 12 bits for intensity of an MR image (i.e., 0 to 4095 values in steps of 1). In general, the brightest region/voxel is assigned an intensity value of 4095 and the darkest region is assigned an intensity value of 0. If there is a bright tissue (e.g., fat) in the field of view (FOV), regions with fat get intensity values close to 4095 and the meniscal region (which typically has low intensity) gets intensity values close to 0. By suppressing fat by a small percentage with a low flip angle (e.g., 30° or 50°) RF pulse, the brightness of the fat can be reduced, which in turn improves the dynamic range of the image for visualization of low intensity pathologies, such as meniscal tears. Further, small FOV options typically have a better dynamic range because the hyper-intensities proximal to the coil(s) are not present in the small FOV. In another embodiment, the computer system 150 could acquire 204 an image of the subject without applying 202 a fat suppression RF pulse (i.e., the step of applying 202 a fat suppression RF pulse could be omitted from the process 200).

Accordingly, the computer system 150 can control the MRI machine 102 to acquire 204 an image of the subject or a region of the subject (e.g., the knee). Further, the computer system 150 can apply 206 the SIGHT described above to the acquired MR image or data to generate a transformed image. Prior to or contemporaneous with applying 206 the SIGHT, the computer system 150 could further, in some embodiments, determine the voxel intensity of the acquired image, determine the maximum intensity present in the acquired MRI image, retrieve values for one or more parameters in the algorithm (e.g., the values for p, q, and C), and perform other tasks necessary for the execution of the algorithm. In particular, the transformed image can be configured to provide improved visualization of a particular low-intensity pathology and/or anatomical structure as compared to the originally acquired MR image. In some embodiments, the values for p, q, and C can be selected based upon the magnetic field strength of the MRI machine 102, the type of pathology or anatomical structure being visualized, and so on. Accordingly, the computer system 150 can output 208 the transformed image. In one embodiment, the computer system 150 could display the transformed image, such as via the display 824 shown in FIG. 3.

Computer System Architecture

Figure 3:
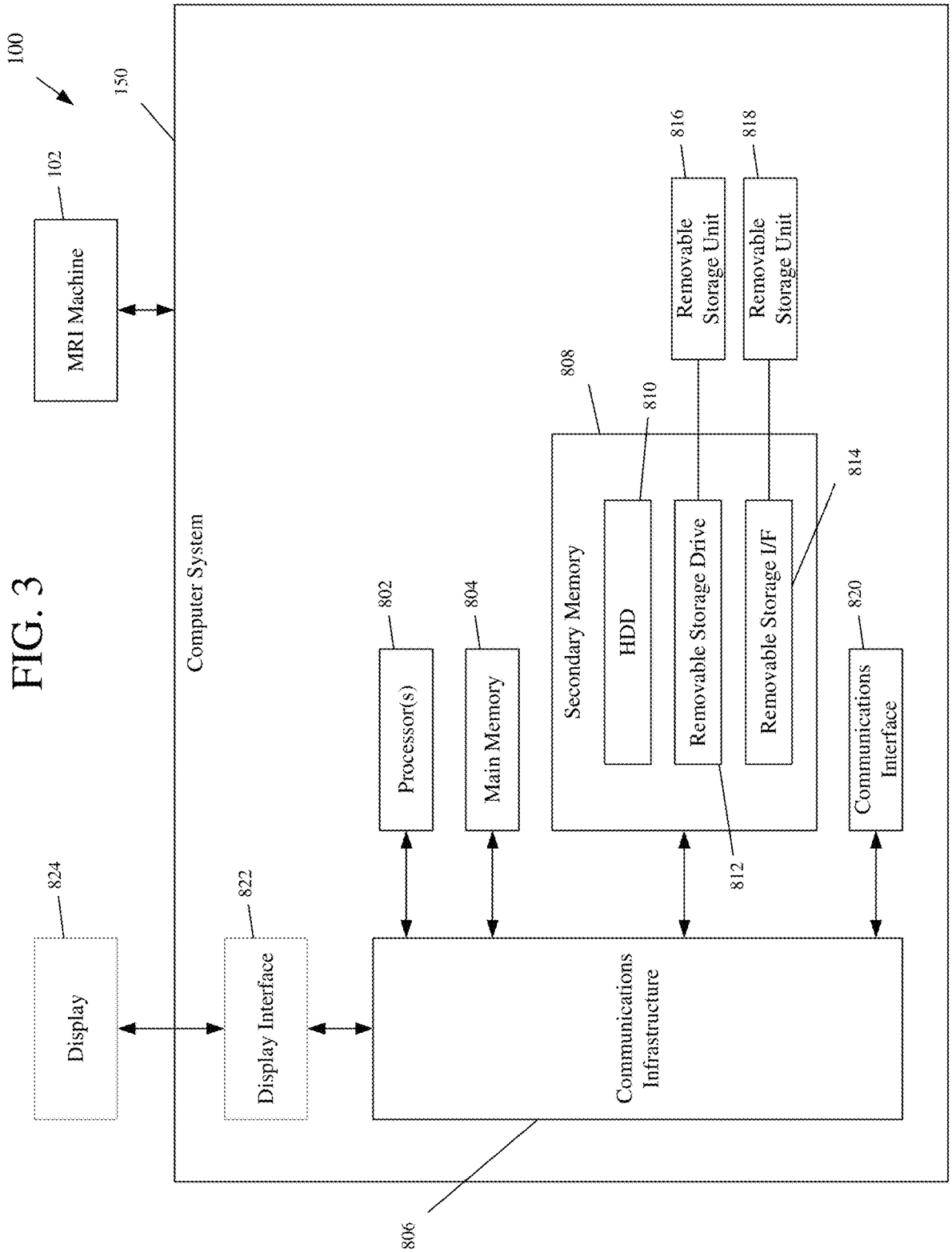
FIG. 3 is a diagram of a computer system architecture, in accordance with at least one aspect of the present disclosure.

FIG. 3 is an architecture diagram of an MRI system 100 that may be used in some embodiments. As noted above, the MRI system 100 can include a computer system 150 and an MRI machine 102. The computer system 150 may include one or more processors 802. Each processor 802 is connected to a communication infrastructure 806 (e.g., a communications bus, cross-over bar, or network). Computer system 150 may include a display interface 822 that forwards graphics, text, and other data from the communication infrastructure 806 (or from a frame buffer, not shown) for display on the display unit 824.

Computer system 150 may also include a main memory 804, such as a random access memory (RAM), and a secondary memory 808. The secondary memory 808 may include, for example, a hard disk drive (HDD) 810 and/or removable storage drive 812, which may represent a floppy disk drive, a magnetic tape drive, an optical disk drive, a memory stick, or the like as is known in the art. The removable storage drive 812 reads from and/or writes to a removable storage unit 816. Removable storage unit 816 may be a floppy disk, magnetic tape, optical disk, or the like. As will be understood, the removable storage unit 816 may include a computer readable storage medium having tangibly stored therein (embodied thereon) data and/or computer software instructions, e.g., for causing the processor(s) to perform various operations.

In alternative embodiments, secondary memory 808 may include other similar devices for allowing computer programs or other instructions to be loaded into computer system 150. Secondary memory 808 may include a removable storage unit 818 and a corresponding removable storage interface 814, which may be similar to removable storage drive 812, with its own removable storage unit 816. Examples of such removable storage units include, but are not limited to, USB or flash drives, which allow software and data to be transferred from the removable storage unit 816, 818 to computer system 150.

Computer system 150 may also include a communications interface 820. Communications interface 820 allows software and data to be transferred between computer system 150 and external devices. Examples of communications interface 820 may include a modem, Ethernet card, wireless network card, a Personal Computer Memory Card International Association (PCMCIA) slot and card, or the like. Software and data transferred via communications interface 820 may be in the form of signals, which may be electronic, electromagnetic, optical, or the like that are capable of being received by communications interface 820. These signals may be provided to communications interface 820 via a communications path (e.g., channel), which may be implemented using wire, cable, fiber optics, a telephone line, a cellular link, a radio frequency (RF) link and other communication channels.

In this document, the terms "computer program medium" and "non-transitory computer-readable storage medium" refer to media such as, but not limited to, media at removable storage drive 812, a hard disk installed in hard disk drive 810, or removable storage unit 816. These computer program products provide software to computer system 150. Computer programs (also referred to as computer control logic) may be stored in main memory 804 and/or secondary memory 808. Computer programs may also be received via communications interface 820. Such computer programs, when executed by a processor, enable the computer system 150 to perform the features of the methods discussed herein. For example, main memory 804, secondary memory 808, or removable storage units 816 or 818 may be encoded with computer program code (instructions) for performing operations corresponding to various processes disclosed herein.

It is understood by those familiar with the art that the system described herein may be implemented in hardware, firmware, or software encoded (e.g., as instructions executable by a processor) on a non-transitory computer-readable storage medium.

EXAMPLES

Various examples and applications of the systems and methods implementing the techniques for improving the visualization of low-intensity pathologies are provided below.

Figure 4:
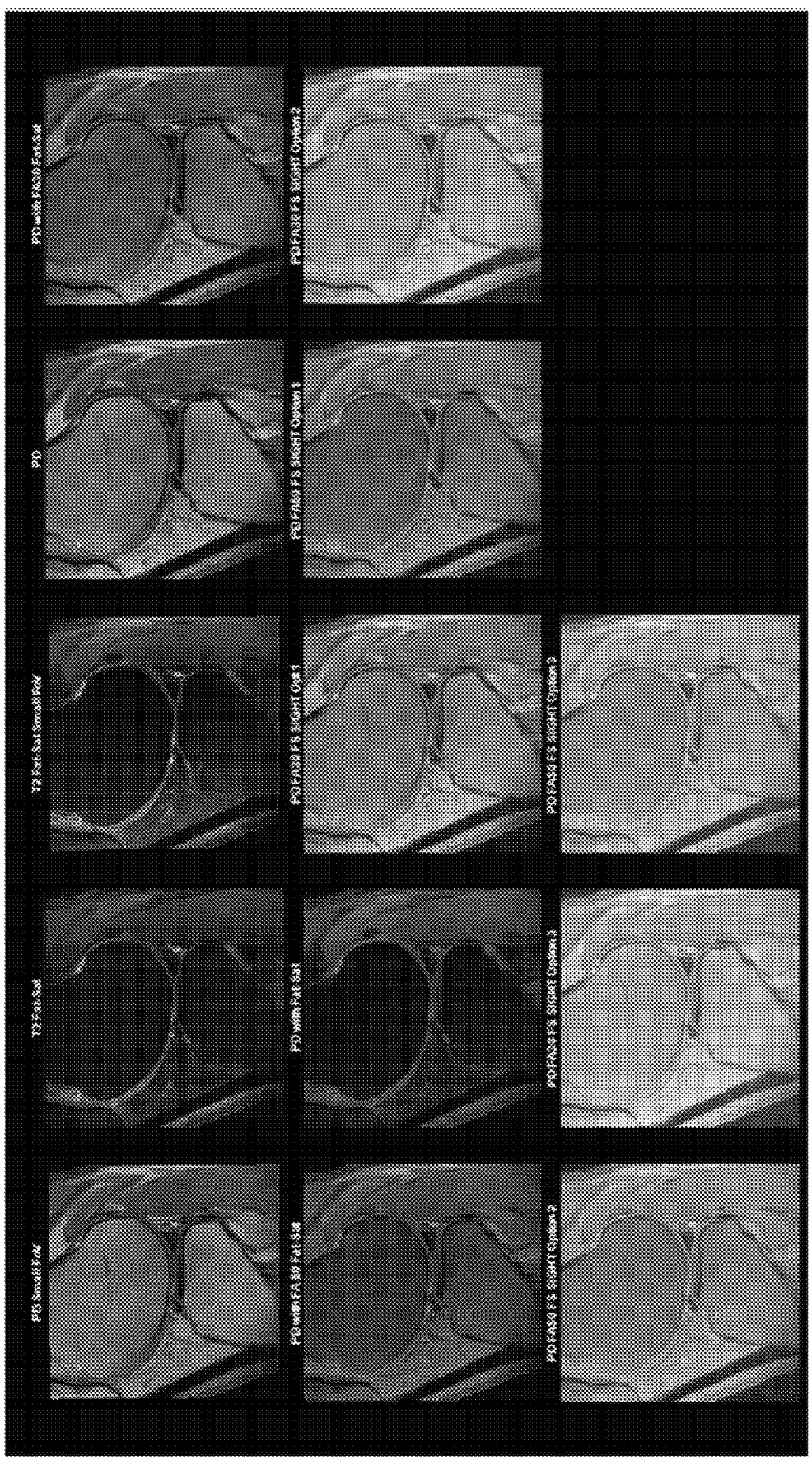
FIG. 4 is a comparison of MR images using various visualization techniques of a meniscal tear for a first subject, in accordance with at least one aspect of the present disclosure.
Figure 5:
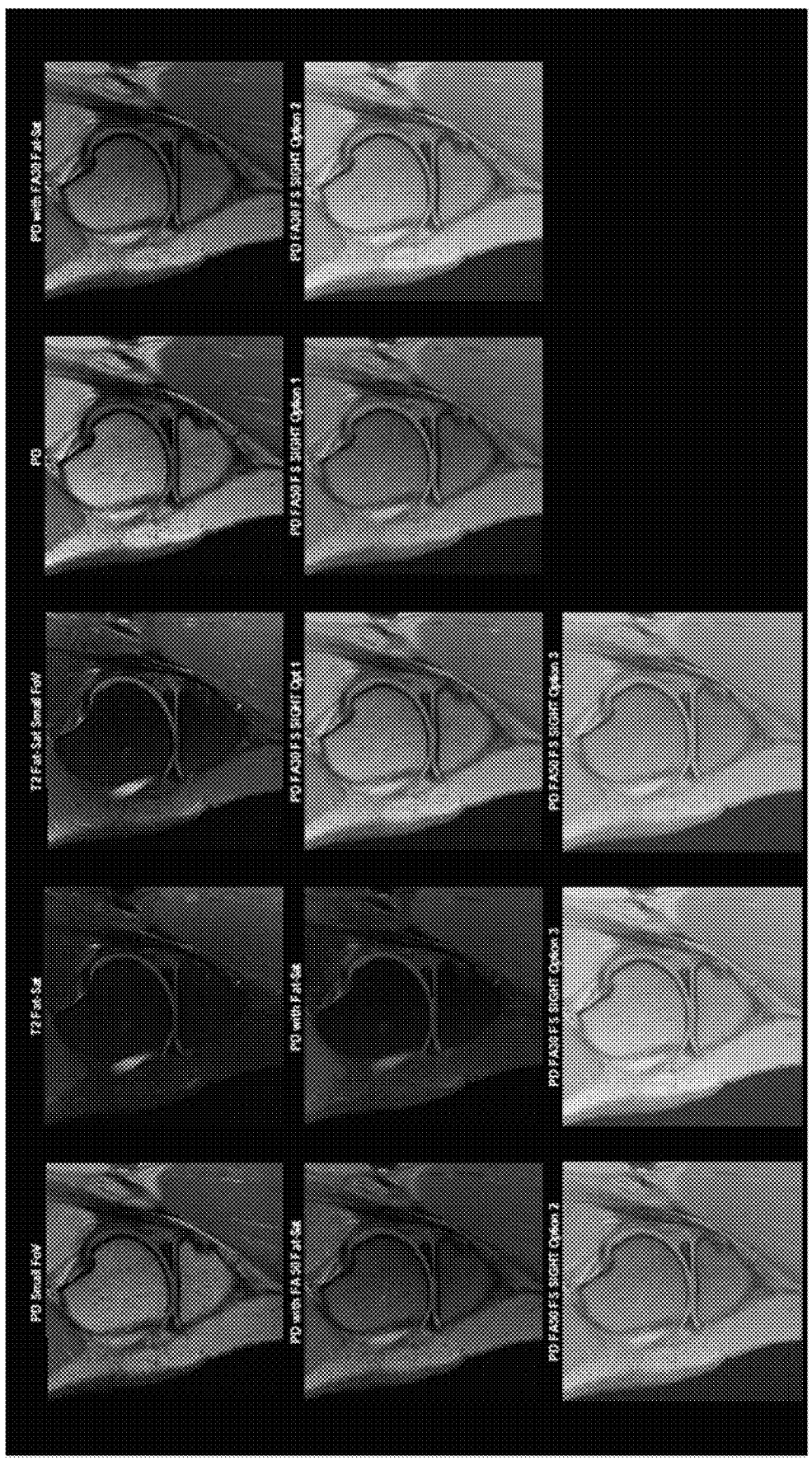
FIG. 5 is a comparison of MR images using various visualization techniques of a meniscal tear for a second subject, in accordance with at least one aspect of the present disclosure.
Figure 6:
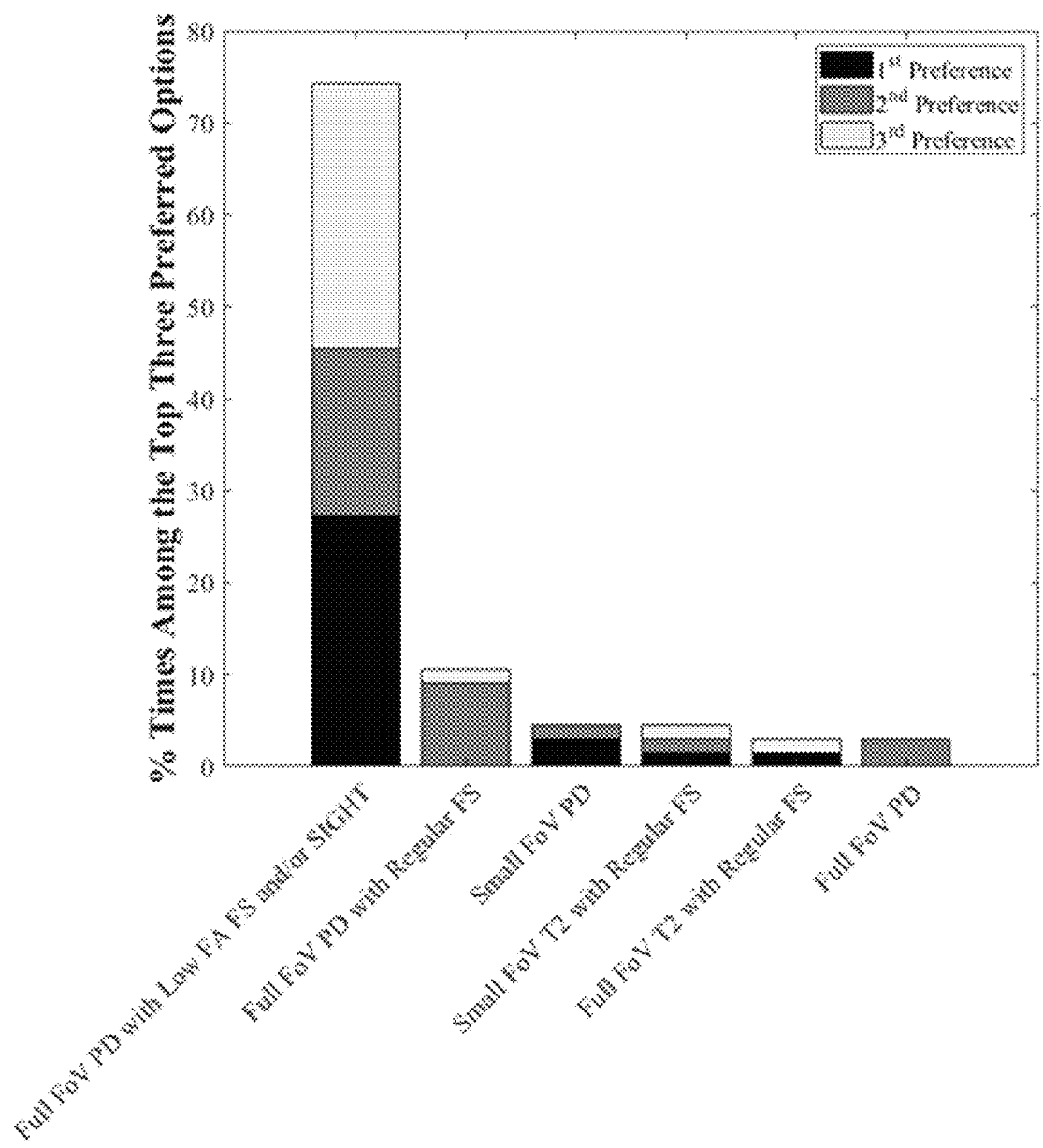
FIG. 6 is a bar graph of practitioner survey results indicating a preference for the images processed using the techniques described herein, in accordance with at least one aspect of the present disclosure.

Referring now to FIG. 4, there is shown a comparison of MR images using various visualization techniques of a meniscal tear for a first representative subject. Each of the images in FIG. 4 was captured at 7T. The intensity range used for display of all PD options was the same (0-4095). The intensity range used for display of the two T2 fat saturation options (full FOV and small FOV) was the same (0-2047). Various images are shown using PD-MRI with a flip angle of 30° (FA30) and a flip angle of 50° (FA50) with a fat suppression RF pulse (FS). Further, these images were also processed using the SIGHT techniques described herein using p/q values of ⅔ (SIGHT Option 1), ½ (SIGHT Option 2) and ⅖ (SIGHT Option 3). As can be seen herein, all of the various images processed using the SIGHT technique improved the conspicuity of meniscal tears as compared to the non-SIGHT images. Similarly, FIG. 5 shows a similar set of images for a second representative subject. As can likewise be seen in FIG. 5, the images processed using the SIGHT techniques described herein improved the conspicuity of meniscal tears as compared to the non-SIGHT images. Further, these preferences for the images processed using the SIGHT techniques were verified empirically through a study gathering survey results of practitioners. FIG. 6 illustrates a stacked bar plot including the percentage of first, second and third preferred ratings received by the images captured at 7T using the various techniques noted above. As can be seen, SIGHT with a small percentage of fat saturation applied to PD-MRI was rated by practitioners to have better conspicuity than the PD- and T2-weighted MRI images that are conventionally used for knee MRI.

In summary, the present disclosure describes systems and methods for generating images that improve the visualization of low-intensity pathologies, such as meniscal tears, as compared to conventional MRI techniques, especially at ultra-high field strengths (e.g., 7T). These systems and methods were not previously known or desired in the technical field because many of the issues described above with respect to imaging low-intensity pathologies are unique to ultra-high field strength MRI systems, which have only recently begun to be approved for clinical use.

Additional description regarding the SIGHT technique and applications thereof can be found in Chebrolu, V., 2020. Subtle Intensity Graduating Homomorphic Transform (SIGHT) with Small Percentage Fat-saturation to Improve Conspicuity of Meniscal Tears at 7T, in ISMRM, which is hereby incorporated by reference herein in its entirety.

While various illustrative embodiments incorporating the principles of the present teachings have been disclosed, the present teachings are not limited to the disclosed embodiments. Instead, this application is intended to cover any variations, uses, or adaptations of the present teachings and use its general principles. Further, this application is intended to cover such departures from the present disclosure that are within known or customary practice in the art to which these teachings pertain.

In the above detailed description, reference is made to the accompanying drawings, which form a part hereof. In the drawings, similar symbols typically identify similar components, unless context dictates otherwise. The illustrative embodiments described in the present disclosure are not meant to be limiting. Other embodiments may be used, and other changes may be made, without departing from the spirit or scope of the subject matter presented herein. It will be readily understood that various features of the present disclosure, as generally described herein, and illustrated in the Figures, can be arranged, substituted, combined, separated, and designed in a wide variety of different configurations, all of which are explicitly contemplated herein.

The present disclosure is not to be limited in terms of the particular embodiments described in this application, which are intended as illustrations of various features. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein are generally intended as "open" terms (for example, the term "including" should be interpreted as "including but not limited to," the term "having" should be interpreted as "having at least," the term "includes" should be interpreted as "includes but is not limited to," et cetera). While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention.

In addition, even if a specific number is explicitly recited, those skilled in the art will recognize that such recitation should be interpreted to mean at least the recited number (for example, the bare recitation of "two recitations," without other modifiers, means at least two recitations, or two or more recitations). Furthermore, in those instances where a convention analogous to "at least one of A, B, and C, et cetera" is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, et cetera). In those instances where a convention analogous to "at least one of A, B, or C, et cetera" is used, in general such a construction is intended in the sense one having skill in the art would understand the convention (for example, "a system having at least one of A, B, or C" would include but not be limited to systems that have A alone, B alone, C alone, A and B together, A and C together, B and C together, and/or A, B, and C together, et cetera). It will be further understood by those within the art that virtually any disjunctive word and/or phrase presenting two or more alternative terms, whether in the description, sample embodiments, or drawings, should be understood to contemplate the possibilities of including one of the terms, either of the terms, or both terms. For example, the phrase "A or B" will be understood to include the possibilities of "A" or "B" or "A and B."

In addition, where features of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, et cetera. As a non-limiting example, each range discussed herein can be readily broken down into a lower third, middle third and upper third, et cetera. As will also be understood by one skilled in the art all language such as "up to," "at least," and the like include the number recited and refer to ranges that can be subsequently broken down into subranges as discussed above. Finally, as will be understood by one skilled in the art, a range includes each individual member. Thus, for example, a group having 1-3 components refers to groups having 1, 2, or 3 components. Similarly, a group having 1-5 components refers to groups having 1, 2, 3, 4, or 5 components, and so forth.

The term "about," as used herein, refers to variations in a numerical quantity that can occur, for example, through measuring or handling procedures in the real world; through inadvertent error in these procedures; through differences in the manufacture, source, or purity of compositions or reagents; and the like. Typically, the term "about" as used herein means greater or lesser than the value or range of values stated by $\frac{1}{10}$ of the stated values, e.g., ±10%. The term "about" also refers to variations that would be recognized by one skilled in the art as being equivalent so long as such variations do not encompass known values practiced by the prior art. Each value or range of values preceded by the term "about" is also intended to encompass the embodiment of the stated absolute value or range of values. Whether or not modified by the term "about," quantitative values recited in the present disclosure include equivalents to the recited values, e.g., variations in the numerical quantity of such values that can occur, but would be recognized to be equivalents by a person skilled in the art.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

The invention claimed is:

1. An MRI system for imaging a subject, the MRI system comprising:
   an MRI machine; and
   a computer system coupled to the MRI machine, the computer system comprising:
      a processor, and
      a memory coupled to the processor, the memory storing instructions that, when executed by the processor, cause the computer system to:
         apply, via the MRI machine, an RF pulse configured to suppress the imaging of fat in the subject,
         acquire, via the MRI machine, an image of the subject,
         apply a transformation to the acquired image to generate a transformed image, the transformation (Y) defined by:

$$Y = \frac{X^{\left(\frac{p}{q}\right)}}{m^{\left(\frac{p}{q}\right)}} \times C$$

wherein X is a voxel intensity of the acquired image, m is a maximum intensity present in the acquired MM image, (p/q) is a scaled power of the transformation that is less than 1, and C is a scalar, and
   output the transformed image.

2. The MM system of claim 1, wherein the RF pulse comprises a low flip angle RF pulse.

3. The MM system of claim 1, wherein the memory stores instructions that, when executed by the processor, cause the computer system to acquire the image via a 2D turbo-spin-echo sequence.

4. The MM system of claim 1, wherein the MRI machine comprises a 7T MM machine.

5. The MM system of claim 1, wherein the transformation is configured to improve visualization of a low-intensity pathology in the transformed image relative to the acquired imaged.

6. The MM system of claim 5, wherein the low-intensity pathology comprises a meniscal tear.

7. A computer-implemented method for imaging a subject, the method comprising:
   applying, via an MRI machine, an RF pulse configured to suppress the imaging of fat in the subject;
   acquiring, via the MRI machine, an image of the subject;
   applying a transformation to the acquired image to generate a transformed image, the transformation (Y) defined by:

$$Y = \frac{X^{\left(\frac{p}{q}\right)}}{m^{\left(\frac{p}{q}\right)}} \times C$$

wherein X is a voxel intensity of the acquired image, m is a maximum intensity present in the acquired MM image, (p/q) is a scaled power of the transformation that is less than 1, and C is a scalar; and
   outputting the transformed image.

8. The computer-implemented method of claim 7, wherein the RF pulse comprises a low flip angle RF pulse.

9. The computer-implemented method of claim 7, wherein acquiring the image of the subject comprises acquiring the image via a 2D turbo-spin-echo sequence.

10. The computer-implemented method of claim 7, wherein the MRI machine comprises a 7T MRI machine.

11. The computer-implemented method of claim 7, wherein the transformation is configured to improve visualization of a low-intensity pathology in the transformed image relative to the acquired imaged.

12. The computer-implemented method of claim 11, wherein the low-intensity pathology comprises a meniscal tear.

* * * * *